US011027532B2

(12) United States Patent
Choi et al.

(10) Patent No.: US 11,027,532 B2
(45) Date of Patent: Jun. 8, 2021

(54) LAMINATE

(71) Applicant: LG Chem, Ltd., Seoul (KR)

(72) Inventors: Eun Young Choi, Daejeon (KR); Se Jin Ku, Daejeon (KR); Sung Soo Yoon, Daejeon (KR); No Jin Park, Daejeon (KR); Jung Keun Kim, Daejeon (KR); Je Gwon Lee, Daejeon (KR); Mi Sook Lee, Daejeon (KR)

(73) Assignee: LG Chem, Ltd.

(*) Notice: Subject to any disclaimer, the term of this patent is extended or adjusted under 35 U.S.C. 154(b) by 203 days.

(21) Appl. No.: 15/580,459

(22) PCT Filed: Jun. 13, 2016

(86) PCT No.: PCT/KR2016/006228
§ 371 (c)(1),
(2) Date: Dec. 7, 2017

(87) PCT Pub. No.: WO2016/200227
PCT Pub. Date: Dec. 15, 2016

(65) Prior Publication Data
US 2018/0170024 A1  Jun. 21, 2018

(30) Foreign Application Priority Data
Jun. 11, 2015 (KR) .................. 10-2015-0082474

(51) Int. Cl.
| | | |
|---|---|---|
| B32B 27/06 | (2006.01) | |
| C08J 7/04 | (2020.01) | |
| C08F 212/08 | (2006.01) | |
| B82Y 40/00 | (2011.01) | |
| G03F 7/00 | (2006.01) | |
| C09D 153/00 | (2006.01) | |
| B05C 11/00 | (2006.01) | |
| B05C 1/00 | (2006.01) | |
| B05C 11/10 | (2006.01) | |
| B05D 7/24 | (2006.01) | |
| B32B 27/30 | (2006.01) | |
| B81C 1/00 | (2006.01) | |

(52) U.S. Cl.
CPC ............. B32B 27/302 (2013.01); B05C 1/00 (2013.01); B05C 11/00 (2013.01); B32B 27/06 (2013.01); B81C 1/0038 (2013.01); B81C 1/00626 (2013.01); C08F 212/08 (2013.01); C08J 7/04 (2013.01); C08J 7/042 (2013.01); C08J 7/0427 (2020.01); C09D 153/00 (2013.01); G03F 7/00 (2013.01); B82Y 40/00 (2013.01); C08J 2453/00 (2013.01)

(58) Field of Classification Search
None
See application file for complete search history.

(56) References Cited

U.S. PATENT DOCUMENTS

| | | | |
|---|---|---|---|
| 2007/0014921 A1* | 1/2007 | Kimball ................ | B44D 2/007 427/258 |
| 2007/0048457 A1* | 3/2007 | Ando ................... | G02B 5/3083 428/1.1 |
| 2008/0193658 A1 | 8/2008 | Millward | |
| 2008/0233435 A1 | 9/2008 | Hasegawa et al. | |
| 2010/0055390 A1 | 3/2010 | Ishizuka et al. | |
| 2011/0190405 A1* | 8/2011 | Delaviz ................ | C08J 9/0061 521/81 |
| 2012/0238109 A1 | 9/2012 | Hattori et al. | |
| 2013/0186462 A1 | 7/2013 | Takezoe et al. | |
| 2013/0248488 A1 | 9/2013 | Han et al. | |
| 2014/0197132 A1 | 7/2014 | Kang et al. | |
| 2014/0287266 A1* | 9/2014 | Watanabe ............. | G11B 5/743 428/800 |

FOREIGN PATENT DOCUMENTS

| | | | |
|---|---|---|---|
| JP | 2005021749 | A | 1/2005 |
| JP | 2008231233 | A | 10/2008 |
| JP | 201058314 | A | 3/2010 |
| JP | 2011187573 | A | 9/2011 |
| JP | 5318217 | B2 | 10/2013 |
| KR | 20100014768 | A | 2/2010 |
| KR | 20120119998 | A | 11/2012 |
| KR | 20130138399 | A | 12/2013 |
| KR | 20140091316 | A | 7/2014 |
| WO | 2012039218 | A1 | 3/2012 |

OTHER PUBLICATIONS

Kevin G. Yager et al., "Self-Assembled Phases of Block Copolymer Blend Thin Films", ACS NANO, vol. 8, No. 10, Oct. 28, 2014, pp. 10582-10588, XP055451747.

M. Serdar Onses et al., "Hierarchical patterns of three-dimensional block-copolymer films formed by electrohydrodynamic jet printing and self-assembly", Nature Nanotechnology, vol. 8, No. 9, Aug. 25, 2013, pp. 667-675, XP055256786.

Iyoda T. et al., "Roll-to-Roll Processable PEO-LC Block Copolymer Template Films with Normally Oriented Nanocylinder Array Structures", Microprocesses and Nanotechnology, 2007 Digest of Papers, IEEE, Piscataway, NJ, USA, Nov. 5, 2007, pp. 460-461, XP031233326.

Extended European Search Report for EP16807867 dated Feb. 23, 2018.

Search report from International Application No. PCT/KR2016/006228, dated Sep. 12, 2016.

(Continued)

*Primary Examiner* — Sheeba Ahmed
(74) *Attorney, Agent, or Firm* — Lerner, David, Littenberg, Krumholz & Mentlik, LLP

(57) ABSTRACT

The present application relates to a laminate, a method for preparing same and a use of the laminate. The present application can provide a method for forming a film, which comprises a self-assembled block copolymer, to have excellent uniformity in thickness even when the film is formed over a large area, a laminate comprising a polymer film formed by means of the method, and a use of same.

8 Claims, 1 Drawing Sheet

(56) References Cited

OTHER PUBLICATIONS

European Examination Report for Application No. 16807867.3 dated Aug. 20, 2020, 6 pages.
Iyoda et al, "Roll-to-Roll Processable PEO-LC Block Copolymer Template Films with Normally Oriented Nanocylinder Array Structures," Microprocesses and Nanotechnology, 2007 Digest of Papers, IEEE, Piscataway, NJ, USA, Nov. 5, 2007, pp. 460-461, XP031233326.
Morikawa et al, "Optical Alignment and Patterning of Nanoscale Microdomains in a Block Copolymer Thin Film," Advanced Materials, Apr. 4, 2006, pp. 883-886, vol. 18, Vo. 7, XP055685017.
Onses et al, "Hierarchical patterns of three-dimensional block-copolymer films formed by electrohydrodynamic jet printing and selfassembly," Nature Nanotechnology, Aug. 25, 2013, pp. 667-675, vol. 8, No. 9, XP055256786.

\* cited by examiner

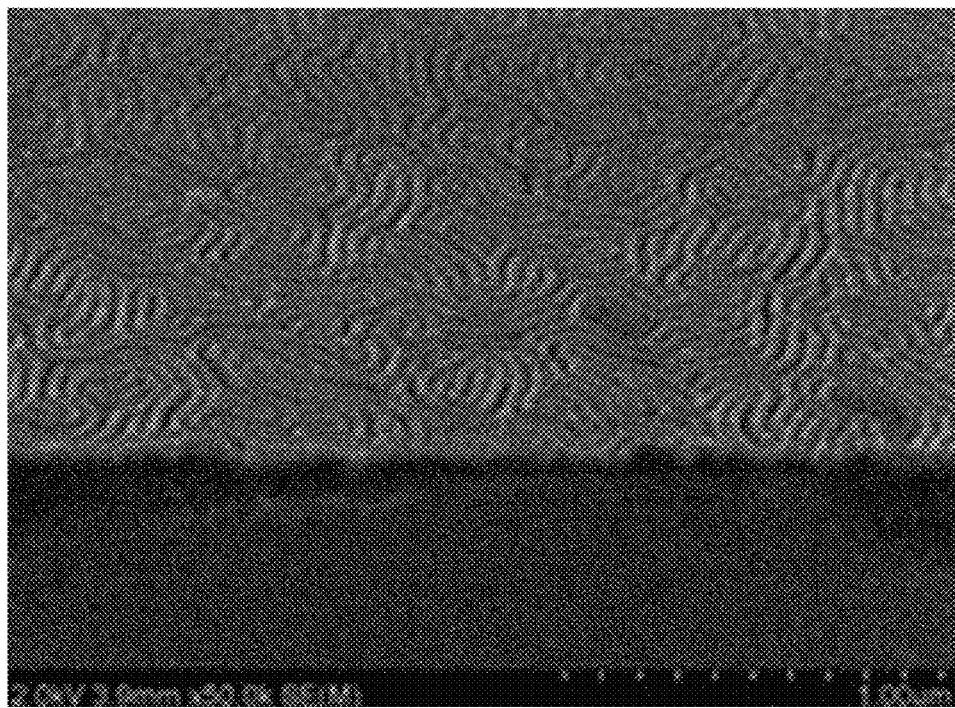

LAMINATE

CROSS-REFERENCE TO RELATED APPLICATIONS

The present application is a national phase entry under 35 U.S.C. § 371 of International Application No. PCT/KR2016/006228, filed on Jun. 13, 2016, which claims priority from Korean Patent Application No. 10-2015-0082474, filed on Jun. 11, 2015, the disclosures of which are incorporated herein by reference.

TECHNICAL FIELD

The present application relates to a laminate, a method for manufacturing the same, and a method for forming a pattern.

BACKGROUND ART

Block copolymers in which two or more chemically distinct polymer chains are linked by covalent bonds can be regularly separated into phase-separation due to self assembly characteristics. Such a phase-separation phenomenon is generally explained by volume fractions, molecular weights and mutual attraction coefficients (Flory-Huggins interaction parameter) between constituents, and as phase-separation structures, structures such as spheres, cylinders, gyroids or lamellae are known.

An important issue in practical applications of various nanostructures formed by the block copolymers is to control orientation of microphases of the block copolymer. If the spherical block copolymer nanostructure is a zero-dimensional structure having no direction of special orientation, the cylindrical or lamellar nanostructure has orientation as one-dimensional and two-dimensional structures, respectively. Typical orientation properties of the block copolymer may include a parallel orientation in which the orientation of the nanostructure is parallel to the substrate direction and a vertical orientation in which the orientation of the nanostructure is vertical to the substrate direction, where the vertical orientation often has greater importance than the parallel orientation.

A coating process using a coating liquid containing a block copolymer is generally required to form a film of a block copolymer that is microphase-separated by self-assembly, for which a spin coating method, a dip coating method, or a spray coating method is generally applied. However, according to the above method, it is difficult to form a film of a block copolymer with a uniform thickness and in particular, when a film of a block copolymer is to be formed in a large area, a film of a block copolymer having a uniform thickness cannot be formed.

Since the characteristics of the phase-separation structure implemented by the block copolymer depend sensitively on the thickness deviation of the film, it is an important problem to form a film having a uniform thickness capable of forming a self-assembled structure.

DISCLOSURE

Technical Problem

The present application provides a laminate, a method for manufacturing the same, and a method for forming a pattern.

Technical Solution

An exemplary laminate of the present application may comprise a substrate and a polymer film formed on one surface of the substrate. The polymer film comprises a block copolymer, where the block copolymer may exist in a self-assembled state. The polymer film comprising the self-assembled block copolymer has excellent thickness uniformity. For example, the polymer film may have a thickness deviation of 100 nm or less, 90 nm or less, 80 nm or less, 70 nm or less, 60 nm or less, or 50 nm or less. In the present application, the term thickness deviation may mean a +, − deviation of the polymer film with respect to the average value of thicknesses measured at 15 to 20 random points of the polymer film, where the thickness of the polymer film may be measured using Ellipsometry or the like. The thickness deviation means that the smaller the numerical value is, the better the thickness uniformity of the polymer film is, so that the lower limit is not limited.

Since the feature of the phase-separation structure due to self-assembly realized by the block copolymer depends sensitively on the thickness deviation of the block copolymer, it is required to form a film having a uniform thickness, but it is difficult to form a film having a uniform thickness in which the thickness deviation is 100 nm or less by a spin coating method, a dip coating method, a spray coating method or the like, and in particular, when the film of the block copolymer is formed in a large area, it is impossible to secure thickness uniformity of the film.

The present applicant has confirmed that the above-mentioned film having a thickness deviation of 100 nm or less can be formed by controlling conditions of a coating process for forming a polymer film comprising a block copolymer as described below. According to this method, even when the film of the block copolymer is formed in a large area, the excellent thickness uniformity can be secured.

Accordingly, the polymer film may be a film having a large area, and for example, a polymer film having an area of 7,500 $mm^2$ or more, 10,000 $mm^2$ or more, 15,000 $mm^2$ or more, 20,000 $mm^2$ or more, 25,000 $mm^2$ or more, 30,000 $mm^2$ or more, 35,000 $mm^2$ or more, 40,000 $mm^2$ or more, 45,000 $mm^2$ or more, 50,000 $mm^2$ or more, 55,000 $mm^2$ or more, 60,000 $mm^2$ or more, 65,000 $mm^2$ or more, or 70,000 $mm^2$ or more. The upper limit of the area in the polymer film is not particularly limited, and for example, the area may be about 100,000 $mm^2$ or less or so.

The polymer film may contain the block copolymer as a main component. In the present application, any subject comprising any component as a main component may mean that the subject comprises at least 55%, at least 60%, at least 65%, at least 70%, at least 75%, at least 80%, at least 85%, at least 90% or at least 95% of the component on the basis of weight. Therefore, the polymer film may further comprise an additive which can be added for forming the film, while comprising the block copolymer as a main component.

The block copolymer in the polymer film may be self-assembled to realize a structure such as a sphere, a cylinder, a gyroid, or a lamella, and to realize any one structure or a combined structure of two or more thereof.

The self-assembled block copolymer in the polymer film may be vertically oriented. In the present application, the term vertical orientation of block copolymer may mean a state in which two or more blocks among the blocks of the block copolymer having different characteristics from each other are simultaneously wetted on the side of a substrate or a neutral layer (neutral brush layer), and for example, a case where the interface between a domain formed by any one block of the block copolymer and a domain formed by another block is substantially perpendicular to the surface of the substrate. Here, the vertically oriented polymer film may form, for example, a so-called lamellar structure.

The thickness of the polymer film is not particularly limited as long as the desired structure can be formed, and can be changed depending on the kind of the used block copolymer. Typically, a polymer film comprising a block copolymer can have a thickness in a range of about 30 nm to 500 nm.

The kind of the block copolymer contained in the polymer film is not particularly limited, and any block copolymer can be applied as long as it can form a phase separation structure by self-assembly. As the block copolymer, for example, polystyrene-b-polymethyl methacrylate (PMMA), polystyrene-b-polyvinyl pyridine (PVP), polystyrene-b-polydimethylsiloxane (PDMS), polystyrene-b-polyethylene oxide (PEO) or polystyrene-b-polyisoprene, and the like may be used, without being limited thereto.

Characteristics of the block copolymer, for example, molecular weight, fraction of each block, and the like are not particularly limited, and for example, can be suitably changed in consideration of the desired phase separation structure and the like.

For example, the block copolymer may have a number average molecular weight (Mn) of, for example, in a range of 20,000 g/mol or more, or 20,000 g/mol to 300,000 g/mol. In the present specification, the term number average molecular weight is a value converted to standard polystyrene measured using GPC (Gel Permeation Chromatograph), and the term molecular weight herein means a number average molecular weight, unless otherwise specified. In another example, the molecular weight (Mn) may be, for example, 250000 g/mol or less, 200000 g/mol or less, 180000 g/mol or less, 160,000 g/mol or less, 140,000 g/mol or less, 120,000 g/mol or less, 100,000 g/mol or less, 90000 g/mol or less, 80000 g/mol or less, 70000 g/mol or less, 60000 g/mol or less, 50000 g/mol or less, 40000 g/mol or less, 30000 g/mol or less, or 25000 g/mol or less or so.

When the block copolymer is a diblock copolymer, the weight ratio of any one block of the block copolymer may be in a range of 30% to 70% or so. However, the ratio may be changed depending on the type of the block copolymer and/or the desired phase separation structure.

The kind of the substrate on which the polymer film is formed is not particularly limited. As the substrate, for example, a silicon substrate such as a silicon wafer, a rigid substrate containing a material such as glass, metal, or metal oxide as a main component; or a flexible substrate containing a polymer material such as PI (poly(imide)), PET (poly(ethylene terephthalate)) or PMMA (poly(methyl methacrylate)) as a main component, and the like can be applied. For example, the substrate may comprise other additives or the like which can be used for forming a film in a required amount, while comprising the above-mentioned components as a main component.

The laminate may comprise additional configurations. In one example, the laminate may further comprise a neutral layer. Such a neutral layer may be present between the substrate and the polymer film. In the present application, the term neutral layer may mean any kind of layer that can induce or assist the vertical orientation of the block copolymer. As the neutral layer, a thermally cross-linkable or photo-cross-linkable neutral layer as a known material or a neutral layer forming a self-assembled monolayer (SAM) through covalent bonds with a functional group of a substrate, a polymer brush, or an MAT (cross-linked random copolymer mat) and the like can be used.

The present application also relates to a method for manufacturing a laminate, and may be, for example, a method for manufacturing a laminate capable of forming a polymer film having a thickness deviation as described above. In order to form a polymer film comprising a block copolymer to a uniform thickness, the present inventors have confirmed that it is necessary to control the boiling point of a solvent in a coating liquid comprising the block copolymer, the ratio of the block copolymer in the solvent, and a speed of coating the coating liquid on a substrate or a neutral layer.

Accordingly, the manufacturing method may comprise a step of coating a coating liquid comprising a block copolymer dissolved in a solvent having a boiling point in a range of 90° C. to 200° C. at a speed of 10 mm/sec to 100 mm/sec.

The type of the solvent that can be used in preparing the coating liquid is not particularly limited as long as it has the above boiling point range. As the solvent, a solvent having a boiling point in the above range may be used, and in another example, the boiling point of the solvent may be 95° C. or more or 100° C. or more. Also, in another example, the boiling point of the solvent may be about 190° C. or less, 180° C. or less, 170° C. or less, or 160° C. or less. The polymer film having the thickness deviation can be formed through a process of coating the coating solution obtained by dissolving the block copolymer at the above concentration in the solvent having the boiling point in the above range at the above speed.

For example, as the solvent, a solvent such as toluene, xylene, PGMEA (propylene glycol monoethyl ether acetate), cyclopentanone, DMF (dimethylformamide), DMSO (dimethyl sulfoxide), anisole or 1,2,4-trichlorobenzene can be used.

The concentration of the block copolymer in the coating solution prepared by dissolving the block copolymer in the above-mentioned solvent is not particularly limited, but it may be appropriate to dissolve the block copolymer in a concentration in the range of about 2% by weight to 30% by weight. In another example, the concentration may be up to 25% by weight, up to 20% by weight, or up to 15% by weight or so. The polymer film having the thickness deviation can be formed through a process of coating the coating solution obtained by dissolving the block copolymer at the above concentration in the solvent having the boiling point in the above range at the above speed.

The coating solution may be coated on the substrate or the neutral layer at a speed of about 10 mm/sec to 100 mm/sec to form a polymer film. Here, the coating speed may be, for example, a moving speed of the substrate or neutral layer on which the coating solution is coated, or a moving speed of the coating means (e.g., a coating means such as a Meyer bar) in a coating apparatus. In another example, the coating speed may be 15 mm/sec or more, 20 mm/sec or more, 25 mm/sec or more, 30 mm/sec or more, 35 mm/sec or more, 40 mm/sec or more, or 45 mm/sec or more. Also, in another example, the coating speed may be 95 mm/sec or less, 90 mm/sec or less, or 85 mm/sec or less or so. The polymer film having the thickness deviation can be formed through a process of coating the coating solution obtained by dissolving the block copolymer at the above concentration in the solvent having the boiling point in the above range at the above speed.

As long as the coating proceeds at the above speed to perform the coating, the method is not particularly limited. The coating may be performed, for example, by a comma coating, a gravure coating, a bar coating or a lip coating method. Considering ease of control of the coating speed, and the like, the coating can be carried out with a bar coating, for example a Meyer bar coating. When the coating proceeds with a bar coating such as a Meyer bar coating, the coating may proceed using a bar, such as a Meyer bar, forming a wet film having a thickness of about 0.5 µm to about 18 µm, about 0.5 µm to 16 µm, about 0.5 µm to about 0.5 µm to 12 µm, about 0.5 µm to 10 µm, about 0.5 µm to 8 µm, about 0.5 µm to 6 µm, about 0.5 µm to 4 µm, or about 0.5 µm to 3 µm or so.

Such a coating can be performed, for example, in a roll-to-roll manner. When the coating is performed in a roll-to-roll process, the coating speed may mean a moving speed of the substrate by the roll in the roll-to-roll process.

The manufacturing method may further comprise a step of forming a neutral layer. Such a step of forming a neutral layer may be performed on the substrate before the step of forming the polymer film. The method for forming the neutral layer is not particularly limited, and any known forming method can be applied. Considering the implementation of a uniform film thickness, the neutral layer can be formed in a coating method. In the case of the coating method, it may be carried out by coating the neutral layer forming liquid, where the type of the solvent for preparing the forming liquid, the concentration of the neutral layer forming material in the solvent, and the coating speed or method may be applied in the same manner as applied to formation of the polymer film.

The manufacturing method may further comprise an annealing process. The annealing step may be carried out followed by the step of forming the polymer film. Here, the annealing process may be a thermal annealing process or a solvent annealing process.

The thermal annealing may be performed, for example, based on the phase transition temperature or the glass transition temperature of the block copolymer, and for example, may be performed at a temperature above the glass transition temperature or the phase transition temperature. The time for performing this thermal annealing is not particularly limited, and it can be performed within a range of, for example, about 1 minute to 72 hours, but this can be changed as required. The heat treatment temperature in the thermal annealing process may be, for example, 100° C. to 250° C. or so, but may be changed in consideration of the kind of the block copolymer and the like.

In addition, the solvent annealing process may also be performed in a non-polar solvent and/or a polar solvent at a suitable room temperature for about 1 minute to 72 hours, but may be changed in consideration of the kind of the block copolymer and the like.

The present application also relates to a method for forming a pattern. The method may comprise, for example, selectively removing any one block of the block copolymer from the laminate. The method may be a method for forming a pattern on the substrate. For example, the method may comprise forming the polymer film comprising the block copolymer on the substrate, selectively removing one or more blocks of the block copolymer present in the film, and then etching the substrate. In this way, it is possible to form, for example, nanoscale fine patterns. In addition, various types of patterns such as nanorods or nanoholes can be formed through the above method depending on the type of the block copolymer in the polymer film. If necessary, the block copolymer may be mixed with other copolymers or homopolymers for pattern formation. The type of the substrate to be applied to this method is not particularly limited, which may be selected as needed, and for example, silicon oxide or the like may be applied.

For example, the method can form a nanoscale pattern of silicon oxide that exhibits a high aspect ratio. For example, after forming the polymer film on silicon oxide and selectively removing any one block of the block copolymer in a state where the block copolymer in the polymer film forms a predetermined structure, silicon oxide may be etched in various ways, for example, reactive ion etching or the like to embody various shapes including patterns of nanorods or nanoholes. In addition, it is possible to embody nano patterns having a large aspect ratio through this method.

For example, the pattern can be implemented on a scale of several tens of nanometers, and such a pattern can be utilized in various applications including, for example, next-generation information electronic magnetic recording media and the like.

Also, in the above structure, the nanowires and nanoholes can have a large aspect ratio.

Here, the method for selectively removing any one block of the block copolymer is not particularly limited, and for example, a method for removing a relatively soft block by irradiating the polymer film with an appropriate electromagnetic wave, for example, ultraviolet and the like can be used. In this case, the ultraviolet irradiation conditions are determined depending on the type of block of the block copolymer, and for example, the method can be performed, for example, by irradiating it with ultraviolet having a wavelength of about 254 nm for 1 minute to 60 minutes.

Following the ultraviolet irradiation, a step of treating the polymer film with an acid or the like to further remove the segment decomposed by ultraviolet may also be performed.

The step of etching the substrate using a mask the polymer film, in which the block is selectively removed, is not particularly limited, which may be performed, for example, through the reactive ion etching step using $CF_4/Ar$ ions or the like, and following this process, a step of removing the polymer film from the substrate by an oxygen plasma treatment or the like can also be performed.

Advantageous Effects

The present application can provide a method capable of forming a film comprising a self-assembled block copolymer to have excellent thickness uniformity even when the film is formed in a large area, a laminate comprising the polymer film formed by the method, and a use thereof.

BRIEF DESCRIPTION OF DRAWINGS

FIG. 1 is a photograph of a polymer film comprising the self-assembled block copolymer formed by Example 1.

MODE FOR INVENTION

Hereinafter, the present application will be described in detail by way of examples according to the present application and comparative examples, but the scope of the present application is not limited by the following examples.

1. Thickness Measurement

The thickness of the polymer film formed in Examples or Comparative Examples was evaluated according to the manufacturer's manual using Ellipsometry (manufacturer: Ellipso Technology, name: Spectroscopic Ellipsometry (Elli-SE-U)).

2. Measurement of Thickness Deviation

The thickness deviation was measured with respect to the polymer film formed from a point about 10 cm away from the coating start point. In the polymer film, 15 to 20 random points were selected, and the thickness of each point was measured in the manner described above, and the thickness deviation was measured through +, − deviation of the film thickness at each point with respect to the average value.

Example 1

Through the roll-to-roll process, the neutral layer and the polymer film were sequentially formed as follows.

Formation of Neutral Layer

A thermally cross-linkable neutral layer was formed on a silicon substrate (8 inch wafer). The neutral layer was formed using a Meyer bar coater equipped with a Meyer bar capable of forming a wet film of about 1.5 μm. The coating liquid for neutral layer formation was prepared by dissolving a neutral layer material in a solvent (anisole) to a concentration of about 2% by weight. As the neutral layer material, a random copolymer obtained by randomly copolymerizing styrene (ST) and methyl methacrylate (MMA) in a molar ratio (ST:MMA) of about 6:4 was used. The coating liquid was coated on the substrate at a Meyer bar moving speed of about 80 mm/sec to a thickness of about 10 nm to 30 nm using the coater, and then heat-treated at a temperature of about 150° C. to 200° C. or so to form a neutral layer.

Formation of Polymer Film

The polymer film was formed by using a block copolymer in which polystyrene blocks having a number average molecular weight of about 50,000 g/mol and polymethyl methacrylate blocks having a number average molecular weight of about 48,000 g/mol are linked by covalent bonds. The block copolymer was dissolved in toluene (boiling point: about 110.8° C.) to a concentration of about 10% by weight to prepare a coating liquid. The coating liquid was coated on the neutral layer of the substrate that the neutral layer is formed on the surface to a thickness of about 100 nm or so by controlling a Meyer bar moving speed to about 80 mm/sec in a coater equipped with a Meyer bar having a wet film thickness of about 2 μm or so. Thereafter, the substrate was heat-treated at 200° C. for about 1 hour to form a vertically oriented plate-like self-assembled structure. FIG. 1 is a photograph of a polymer film comprising the self-assembled block copolymer formed by Example 1.

Example 2

A polymer film was formed in the same manner as in Example 1, except that the concentration of the block copolymer was changed to about 5% by weight in the coating liquid applied upon forming the polymer film.

Example 3

A polymer film was formed in the same manner as in Example 1, except that the Meyer bar moving speed was changed to about 50 mm/sec upon forming the polymer film.

Example 4

A polymer film was formed in the same manner as in Example 1, except that anisole (boiling point: about 155° C.) was used as a solvent upon preparing the coating liquid for production of the polymer film.

Comparative Example 1

A polymer film was formed in the same manner as in Example 1, except that the Meyer bar moving speed was changed to about 5 mm/sec upon forming the polymer film.

Comparative Example 2

A polymer film was formed in the same manner as in Example 1, except that 1,2,4-trichlorobenzene (boiling point: about 215° C.) was used as a solvent upon preparing the coating liquid for production of the polymer film.

The average thicknesses and thickness deviations of the polymer films measured for the polymer films of Examples 1 to 4 and Comparative Examples 1 and 2 were summarized and described in Table 1 below.

TABLE 1

|  | Average Thickness (unit: nm) | Thickness Deviation (unit: nm) |
|---|---|---|
| Example 1 | 95 | 20 |
| Example 2 | 60 | 15 |
| Example 3 | 150 | 30 |
| Example 4 | 200 | 25 |
| Comparative Example 1 | 300 | 120 |
| Comparative Example 2 | 250 | 110 |

From the results shown in Table 1, it can be confirmed that, by controlling the boiling point of the solvent in the coating liquid solvent and the coating speed during the coating process, films having a uniform thickness and comprising the self-assembled block copolymer can be formed.

The invention claimed is:

1. A method for manufacturing a laminate, the laminate comprising a substrate and a polymer film, the method comprising:
    coating a coating liquid on a substrate at a coating speed of 10 mm/sec to 100 mm/sec using a coating means;
    annealing the coating liquid to form a polymer film,
    wherein the coating liquid comprising a block copolymer dissolved in a solvent having a boiling point in a range of 90° C. to 200° C.,
    wherein the coating speed is a moving speed of the substrate relative to the coating means, or a moving speed of the coating means relative to the substrate, and
    wherein the coating of the coating liquid is performed by a bar coating method.

2. The method for manufacturing a laminate according to claim 1, wherein the solvent is toluene, xylene, PGMEA, cyclopentanone, DMF, DMSO, or anisole.

3. The method for manufacturing a laminate according to claim 1, wherein the block copolymer in the solvent has a concentration in a range of 2% by weight to 30% by weight.

4. The method for manufacturing a laminate according to claim 1, wherein the coating of the coating liquid is performed by the bar coating method, and wherein the bar coating method is performed by using a bar having a wet film thickness in a range of 0.5 μm to 18 μm.

5. The method for manufacturing a laminate according to claim 1, wherein the coating is performed in a roll-to-roll manner.

6. The method for manufacturing a laminate according to claim 1, further comprising:
    forming a neutral layer on the surface of the substrate prior to coating the coating liquid.

7. A method for forming a pattern, comprising:
    selectively removing any one block of the block copolymer from the polymer film of the laminate manufactured according to the method of claim 1.

8. The method for manufacturing a laminate according to claim 1, wherein the block copolymer is polystyrene-b-polymethyl methacrylate, polystyrene-b-polyvinyl pyridine, polystyrene-b-polydimethylsiloxane, polystyrene-b-polyethylene oxide or polystyrene-polyisoprene.

\* \* \* \* \*